(12) United States Patent
Sung et al.

(10) Patent No.: US 8,188,649 B2
(45) Date of Patent: May 29, 2012

(54) ORGANIC LIGHT EMITTING DIODE DISPLAY DEVICE AND METHOD OF FABRICATING THE SAME

(75) Inventors: Yeun-Joo Sung, Suwon-si (KR); Sam-Il Kho, Suwon-si (KR); Byeong-Wook Yoo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 124 days.

(21) Appl. No.: 12/003,619

(22) Filed: Dec. 28, 2007

(65) Prior Publication Data

US 2008/0157663 A1 Jul. 3, 2008

(30) Foreign Application Priority Data

Dec. 28, 2006 (KR) .................. 10-2006-0136777

(51) Int. Cl.
*H05B 33/26* (2006.01)

(52) U.S. Cl. ........................ 313/503; 313/504

(58) Field of Classification Search .......... 313/498–512; 315/169.3; 345/36, 45, 76
See application file for complete search history.

(56) References Cited

U.S. PATENT DOCUMENTS

| | | | | |
|---|---|---|---|---|
| 6,280,861 | B1* | 8/2001 | Hosokawa et al. | 428/690 |
| 2004/0023010 | A1* | 2/2004 | Bulovic et al. | 428/209 |
| 2004/0140757 | A1* | 7/2004 | Tyan et al. | 313/504 |
| 2004/0157167 | A1 | 8/2004 | Morii | |
| 2005/0052118 | A1 | 3/2005 | Lee et al. | |
| 2005/0067950 | A1* | 3/2005 | Nonoue et al. | 313/504 |
| 2005/0084994 | A1 | 4/2005 | Yamazaki et al. | |
| 2006/0232195 | A1* | 10/2006 | Cok et al. | 313/504 |

FOREIGN PATENT DOCUMENTS

| | | |
|---|---|---|
| CN | 1753593 | 3/2006 |
| JP | 2003-068470 | 3/2003 |
| JP | 2003338386 | 11/2003 |
| JP | 2005-093386 | 4/2005 |
| JP | 2005276755 | 10/2005 |
| JP | 2005-340202 | 12/2005 |
| JP | 2007-335348 | 12/2007 |
| KR | 10-201-0078298 | 8/2001 |
| KR | 10-2003-0057634 | 7/2003 |
| KR | 10-2005-0024388 | 3/2005 |

(Continued)

OTHER PUBLICATIONS

Notice of Allowability from the Korean Intellectual Property Office issued in Applicant's corresponding Korean Patent Application No. 10-2006-0136777 dated Aug. 18, 2008.

(Continued)

*Primary Examiner* — Nimeshkumar Patel
*Assistant Examiner* — Christopher Raabe
(74) *Attorney, Agent, or Firm* — Robert E. Bushnell, Esq.

(57) ABSTRACT

An organic light emitting diode (OLED) display device includes a substrate, a first electrode disposed on the substrate, an organic layer including an emission layer disposed on the first electrode, and a second electrode including stacked layers of Yb and Ag on the organic layer. A method of fabricating the organic light emitting diode (OLED) display device includes providing a substrate, forming a first electrode on the substrate, forming an organic layer including an emission layer on the first electrode, and forming a second electrode including stacked layers of Yb and Ag on the organic layer.

17 Claims, 5 Drawing Sheets

FOREIGN PATENT DOCUMENTS

| WO | 9954943 A1 | 10/1999 |
|---|---|---|
| WO | 02/063701 | 8/2002 |
| WO | 2005096405 A1 | 10/2005 |

OTHER PUBLICATIONS

Chinese Office Action issued on Aug. 28, 2009 by the Chinese Patent Office in the corresponding Chinese Patent Application No. 200710305867.8.

X. L. Zhu et al., "29.3: Very Bright and Efficient Top-Emitting OLED with Ultra-Thin Yb as Effective Electron Injector", SID 06 Digest, pp. 1292-1295.

*Office action* from the Korean Intellectual Property Office issued in Applicant's corresponding Korean Patent Application No. 10-2006-0136777 dated Nov. 29, 2007.

Ran, et al., "Light extraction efficiency of a top-emission organic light-emitting diode with an Yb/Au double-layer cathode and an opaque Si anode", Applied Optics, vol. 45, No. 23, pp. 5871-5876 (2006).

Lai, et al., "Applications of Ytterbium in organic light-emitting devices as high performance and transparent electrodes", Chemical Physics Letters, 366 (2002), pp. 128-133.

\* cited by examiner

ORGANIC LIGHT EMITTING DIODE DISPLAY DEVICE AND METHOD OF FABRICATING THE SAME

CROSS-REFERENCE TO RELATED APPLICATION AND CLAIM FOR PRIORITY

This application claims priority to and the benefit of Korean Patent Application No. 2006-0136777, filed on Dec. 28, 2006, the disclosure of which is incorporated herein by reference in its entirety.

BACKGROUND OF THE INVENTION

1. Field of the Invention

The present invention relates to an organic light emitting diode (OLED) display device and a method of fabricating the same.

2. Description of the Related Art

Generally, an organic light emitting diode (OLED) display device is an emitting display device, in which an electron and a hole are respectively inserted from an electron injecting electrode (cathode) and a hole injecting electrode (anode) into an emission layer, and the injected electron and hole are combined to thereby create an exciton, which emits light when transitioning from an excited state to a ground state.

Unlike a conventional liquid crystal thin film display device, a separate light source is not required due to the above structure, and this results in reduced size and weight of a device.

Generally, an OLED display device includes a substrate, a lower electrode disposed on the substrate, an organic layer including an emission layer disposed on the lower electrode, and an upper electrode disposed on the organic layer. The organic layer may further include a hole injection layer (HIL), a hole transport layer (HTL), and an electron blocking layer (EBL) between the lower electrode and the emission layer, and a hole blocking layer (HBL), an electron transport layer (ETL), and an electron injection layer (EIL) between the emission layer and the upper electrode.

Also, the OLED display device may be classified into a bottom-emitting type and a top-emitting type depending on an emission direction of light generated from the emission layer. In the bottom-emitting type, light emits towards the substrate, an upper electrode is formed of a reflective electrode, and a lower electrode is formed of a transparent electrode. Here, when the OLED display device adopts an active matrix type, in which a thin film transistor is formed, light cannot pass through a region where the thin film transistor is formed, and thus an area through which light can pass is reduced. In contrast, in the top-emitting type, an upper electrode is formed of a semi-transmissive metal layer, and a lower electrode is formed of a transparent electrode including a reflective layer, so that light emits towards a direction opposite to a substrate, and an area through which light passes becomes larger than that of the bottom-emitting type.

In a conventional top-emitting OLED display device, an upper electrode is formed of a transparent conductive material such as Indium Tin Oxide (ITO) or Indium Zinc Oxide (IZO) or a very thin metal layer such as magnesium-silver (MgAg) so that light passes through the upper electrode.

However, when the upper electrode is formed of the transparent conductive material such as ITO or IZO, the upper electrode may have a high transmittance, but it is not appropriate due to a high work function when an upper electrode is a cathode. Also, when the upper electrode is formed of the semi-transmissive metal layer such as MgAg, the semi-transmissive metal layer should be formed thin in order to enhance transmittance, so that it has a problem of an increased resistance value.

SUMMARY OF THE INVENTION

The present invention provides an improved organic light emitting diode (OLED) display device.

According to an aspect of the present invention, there is provided a top-emitting organic light emitting diode (OLED) display device.

According to an aspect of the present invention, there is provided a method of making an organic light emitting diode (OLED) display device.

In an exemplary embodiment of the present invention, an OLED display device includes: a substrate; a first electrode disposed on the substrate; an organic layer including an emission layer, the organic layer formed on the first electrode; and a second electrode including an ytterbium (Yb) layer formed on the organic layer and a silver (Ag) formed on the ytterbium layer.

In an exemplary embodiment of the present invention, a top-emitting organic light emitting diode (OLED) display device, comprising: a substrate; a first electrode disposed on the substrate, the first electrode comprising a reflective layer and a transparent electrode material formed on the reflective layer; an organic layer including an emission layer, the organic layer formed on the first electrode; and a second electrode including an ytterbium (Yb) layer formed on the organic layer and a silver (Ag) formed on the ytterbium layer, the second electrode having a thickness of 90 Å to 120 Å.

In an exemplary embodiment of method of manufacturing an OLED display device, a method of fabricating an OLED display device includes: providing a substrate; forming a first electrode on the substrate; forming an organic layer including an emission layer on the first electrode; and forming a second electrode comprising an Yb layer formed on the organic layer and a Ag layer formed on the Yb layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
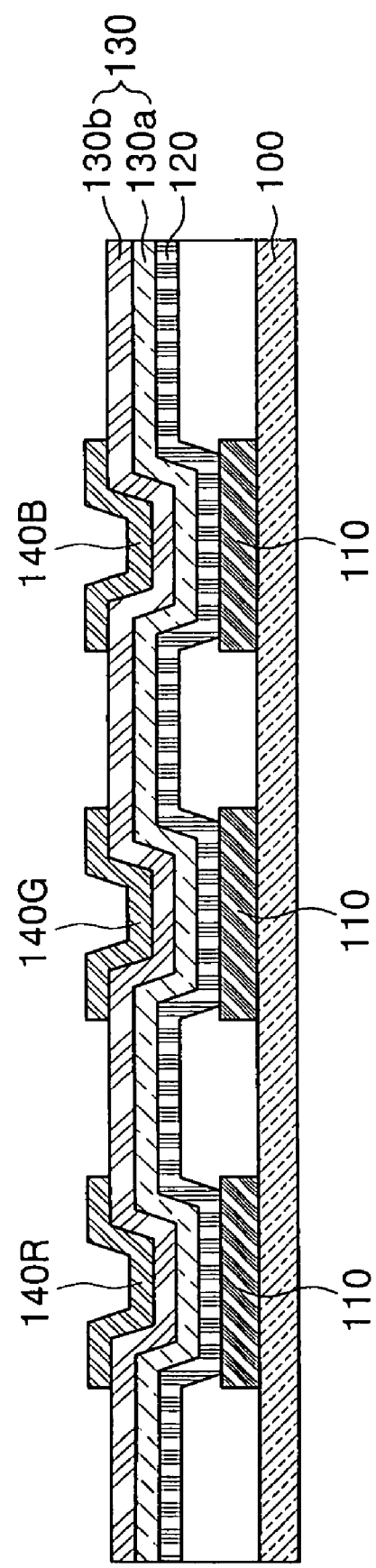
FIG. 1 is a cross-sectional view of an organic light emitting diode (OLED) display device according to a first exemplary embodiment of the present invention.

The present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements.

FIG. 1 is a cross-sectional view of a top-emitting organic light emitting diode (OLED) display device according to a first exemplary embodiment of the present invention.

Referring to FIG. 1, a first electrode 110 is formed on a substrate 100. The substrate 100 may include at least one thin film transistor (not shown) in contact with the first electrode 110.

The first electrode 110 may be a reflective anode electrode. In this case, the reflective anode electrode includes a reflective layer formed of silver (Ag), aluminum (Al), chrome (Cr), molybdenum (Mo), tungsten (W), titanium (Ti), gold (Au), palladium (Pd) or an alloy thereof, and a transparent electrode material such as Indium Tin Oxide (ITO), Indium Zinc Oxide (IZO) or Zinc Oxide (ZnO) which is stacked on the reflective layer. The formation of the first electrode 110 may be performed by a sputtering method, a vapor phase deposition method, an ion beam deposition method, an electron beam deposition method or a laser ablation method.

An organic layer 120 including an emission layer is formed on the first electrode 110. The emission layer may be a white light emission layer or a blue light emission layer, and the white light emission layer may be a single layer or a multilayer.

When the white light emission layer is a single layer, the single layer may be formed of plural light emitting materials to emit white light. For example, the single layer may be obtained by mixing a red light emitting material, a green light emitting, and a blue light emitting material. The red light emitting material may be formed of one of polythiophene (PT) and a derivative thereof which are polymers. The green light emitting material is formed of a small molecular material such as 8-hydroquinoline aluminum ($Alq_3$), bis(benzoquinolinolato)beryllium complex ($BeBq_2$) or tris(4-methyl-8-quinolinolato)aluminum (Almq), or a polymer such as poly(p-phenylenevinylene)(PPV) 11 or a derivative thereof. The blue light emitting material is formed of a small molecular material such as bis[2-(2-hydroxyphenyl)benzoxazolate]zinc (ZnPBO), bis(8-hydroxyquinolato)-(4-phenylphenolato)aluminum (Balq), 4,4'-bis(2,2-diphenyl-vinyl)-biphenyl (DPVBi) or OXA-D, or a polymer such as polyphenylene (PPP) or a derivative thereof.

When the white light emission layer is a multilayer, it may be formed of double layers emitting light of different wavelength regions. One of the double layers may be an emission layer emitting light of an orange-red region and the other may be an emission layer emitting light of a blue region. The emission layer emitting light of an orange-red region may be a phosphorescent emission layer, and the emission layer emitting light of a blue region may be a fluorescent emission layer. The phosphorescent emission layer has much better emission characteristics than the fluorescent layer emitting light of the same wavelength region, and the fluorescent emission layer has much better life span characteristics than the phosphorescent emission layer. Therefore, when a white light emission layer is formed by stacking the phosphorescent emission layer emitting light of an orange-red region and the fluorescent emission layer emitting light of a blue light region, its emission efficiency and life span characteristics may be excellent. Also, the emission layer that is a double-layer may be formed of a polymer, a small molecular material or a combination thereof.

When the white light emission layer has a three-layer structure, it may be a layer, in which red, green, and blue light emission layers are stacked, and the stacking sequence is not particularly defined.

The red light emission layer may be formed of a small molecular material 11 such as $Alq_3$ (a host)/DCJTB (4-(dicyanomethylene)-2-1-propyl-6-(1,1,7,7-tetramethyljulolidyl-9-phenyl)-4H-pyran; a fluorescent dopant), $Alq_3$ (a host)/DCM (4-dicyanomethylene-2-methyl-6-(p-dimethylamino-styryl)-4H-pyran; a fluorescent dopant) or CBP (4,4'-N,N'-dicarbazole-biphenyl; a host)/PtOEP (2,3,7,8,12,13,17,18-octaethyl-21H,23H-phorpine platinum(II); a phosphorescent organic metal complex), or a polymer such as a polyfluorene (PFO)-based polymer or a poly(phenylene vinylene) (PPV)-based polymer.

The green light emission layer may be formed of a small molecular material such as $Alq_3$, $Alq_3$ (a host)/C545t (a dopant) or CBP (a host)/IrPPY (tris(2-phenylpyridine)-iridium; a phosphorescent organic material complex), or a polymer such as a PFO-based polymer or a PPV-based polymer.

The blue light emission layer may be formed of a small molecular material such as 4,4'-bis(2,2-diphenyl-vinyl)-biphenyl (DPVBi), spiro-DPVBi, spiro-6P, distyrylbenzene (DSB) or distyrylarylene (DSA), or a polymer such as a PFO-based polymer or a PPV-based polymer.

Also, the organic layer 120 may further include at least one layer selected from the group consisting of a hole injection layer (HIL), a hole transport layer (HTL), an electron blocking layer (EBL), a hole blocking layer (HBL), an electron injection layer (EIL), and an electron transport layer (ETL).

The HIL serves to facilitate injection of a hole into an organic emission layer to thereby increase the life span of a device. The HIL may be formed of an aryl amine compound and/or a starburst-type amine. More specifically, the HIL may be formed of at least one of 4,4',4''-tris[(3-methylphenyl(phenyl)amino)]triphenylamine (m-MTDATA), 1,3,5-tris[4-(3-methylphenylphenylamino)phenyl]benzene (m-MTDATB), phthalocyanine copper (CuPc), etc.

The HTL may be formed of an arylene diamine derivative, a starburst-type compound, a biphenyl diamine derivative having a spiro radical, a ladder-type compound, or so forth. More specifically, the HTL may be formed of N,N-diphenyl-N,N'-bis(3-methylphenyl)-1,1'-biphenyl-4,4'-diamine (TPD) or 4,4'-bis[N-(1-naphthyl)-N-phenylamino]biphenyl (α-NPB);

The EBL acts to prevent an exciton generated in the emission layer in the process of driving an OLED display device from being diffused. The EBL may be formed of bis(8-hydroxyquinolato)-(4-phenylphenolato)aluminum (Balq), 2,9-dimethyl-4,7-diphenyl-1,10-phenanthroline (BCP), CF-X, 3-phenyl-4-(1'-naphthyl)-5-phenyl-1,2,4-triazole (TAZ) or spiro-TAZ.

The HBL serves to prevent a hole from moving into the EIL when hole mobility is larger than electron mobility in the organic emission layer. The HBL may be formed of one selected from the group consisting of 2-(4-biphenyl)-5-(4-butylphenyl)-1,3,4-oxadiazole (PBD), spiro-PBD, and 3-(4-biphenyl)-4-phenyl-5-(4-tert-butyl phenyl)-1,2,4-triazole (TAZ).

The ETL is formed of a metal compound capable of readily receiving an electron, and may be formed of 8-hydroquinoline aluminum ($Alq_3$) having excellent characteristics capable of safely transporting the electron supplied from a cathode electrode.

The EIL may be formed of at least one selected from the group consisting of 1,3,4-oxadiazole derivatives, 1,2,4-triazole derivatives and LiF.

In addition, the organic layer 120 may be formed by one of a vacuum deposition method, an ink jet printing method, and a laser induced thermal imaging method.

A second electrode 130 including stacked layers of Yb and Ag 130a and 130b is formed on the organic layer 120. The second electrode 130 is formed by respectively depositing Yb and Ag using a sputtering method or a vacuum deposition method. Here, the second electrode 130 may be formed to a thickness of 90 Å to 120 Å. When the thickness of the second electrode is larger than 90 Å, the electrode may effectively operate as an upper electrode since it has a sheet resistance of 45 ohm/square or lower, and when the thickness of the second electrode is smaller than 120 Å, a transmittance of 40% or more may be attained over the entire emission wavelength range of the emission layer. More specifically, Yb may be formed to a thickness of 20 Å to 30 Å, and Ag may be formed to a thickness of 70 Å to 90 Å. When the thickness of Yb ranges from 20 Å to 30 Å or when the thickness of Ag is 70 Å or larger, a sheet resistance of 45 ohm/square or lower may be obtained, so that the second electrode may effectively operate as an upper electrode. Also, when the thickness of Ag is 90 Å or smaller, a transmittance of 40% or higher may be obtained over the emission wavelength range of the emission layer, i.e., within a range of 380 nm to 765 nm.

The second electrode 130 including the stacked layer of Yb and Ag has an excellent transmittance over the entire emission wavelength range, so that much higher emission efficiency may be attained compared to the conventional second electrode formed of a semi-transmissive metal layer. Furthermore, microcavity effects generated when the second electrode is formed of a semi-transmissive metal layer may be efficiently removed, so that it may prevent emitted light from leaning to a certain wavelength range. Therefore, in the OLED display device including the white light emission layer implemented by mixing light of different wavelengths, when the second electrode is formed of stacked layers of Yb and Ag, light of each corresponding wavelength may uniformly pass through the second electrode to thereby implement the pure white light. Moreover, since the electrode has a sheet resistance lower than that suitable for an electrode to be used at a predetermined thickness, it effectively acts as an upper electrode in a top-emitting type.

A transparent passivation layer may be disposed on the second electrode 130. The transparent passivation layer may be formed of an inorganic layer, an organic layer or a combination thereof. The inorganic layer may be formed of ITO, IZO, $SiO_2$, SiNx, $Y_2O_3$ or $Al_2O_3$, and the organic layer may be formed of parylene or HDPE. The transparent passivation layer may serve to prevent the lower organic layers from being deteriorated by external moisture or oxygen.

When the emission layer is a white light emission layer or a blue light emission layer, a color filter layer or color conversion layers 140R, 140G, and 140B may be disposed on the transparent passivation layer. The color filter layer may include a pigment and a polymer binder, and may be classified into red, green, and blue light filter layers depending on the type of the pigment. Each color filter layer is characterized in that it can select wavelengths of a red light region, a green light region, and a blue light region from white incident light from emitted the emission layer. The color conversion layer may include a fluorescent material and a polymer binder. The fluorescent material is excited by the light incident from the emission layer and transitions to a ground state to thereby emit light with wavelengths longer than the incident light. The color conversion layer is classified into red, green and blue color conversion layers converting the blue light incident from the emission layer to red, green and blue colors, respectively, depending on the type of the fluorescent material.

Figure 2:
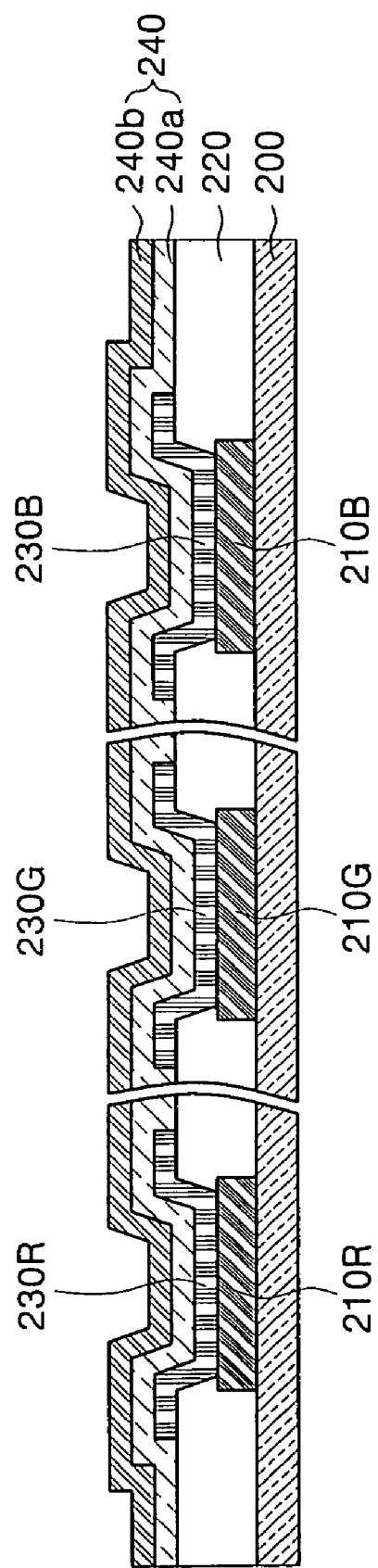
FIG. 2 is a cross-sectional view of an OLED display device according to a second exemplary embodiment of the present invention.

FIG. 2 is a cross-sectional view of a top-emitting OLED display device according to a second exemplary embodiment of the present invention.

In the top-emitting OLED display device according to a second embodiment of the present invention, red, green and blue emission layers are respectively formed in red (R), green (G), and blue (B) unit pixel regions. Unless otherwise indicated in the second embodiment, a reference will be made to the disclosure of the first embodiment.

Referring to FIG. 2, a substrate 200 having red (R), green (G), and blue (B) unit pixel regions is provided. First electrodes 210R, 210G and 210B are disposed in each unit pixel region of the substrate. The substrate 200 may have thin film transistors (not shown), each of which is in contact with the first electrodes 210R, 210G and 210B. An insulating layer 220 defining a pixel region is disposed between the first electrodes.

Organic layers 230R, 230G and 230B respectively including red, green and blue emission layers are disposed on each first electrode in each pixel region. The emission layer may be formed by a vacuum deposition method using a fine metal mask, an ink jet printing method, or a laser induced thermal imaging method.

The organic layer may further include at least one layer selected from the group consisting of a hole injection layer (HIL), a hole transport layer (HTL), an electron blocking layer (EBL), a hole blocking layer (HBL), an electron injection layer (EIL), and an electron transport layer (ETL).

A second electrode layer 240 including stacked layers 240a and 240b of Yb and Ag is formed on the organic layer.

Since the second electrode layer 240 including the stacked layer of Yb and Ag has an excellent transmittance over the entire emission wavelength range, external emission efficiency of light generated from each emission layer of the red, green and blue pixel regions is increased to thereby have a much higher emission efficiency than the conventional second electrode formed of a semi-transmissive metal layer. Also, since the electrode has a sheet resistance of an appropriate value suitable for an electrode to be used at a predetermined thickness, it is suitable for an upper electrode in a top-emitting structure.

Experimental examples will be provided below in order to help understand the present invention. However, the following examples are only intended to help understand, but not to restrict the present invention.

Experimental Example 1

A first electrode having an area of 2 mm×2 mm was formed on a substrate using ITO, and was subjected to ultrasonic cleaning and pretreatment process (a UV-$O_3$ process, and a heat treatment process). A hole injection layer was formed by vacuum depositing IDE406 (available from Idemitsu Co. Ltd.) to a thickness of 750 Å on the first electrode. A hole transport layer was formed by vacuum depositing IDE320 (available from Idemitsu Co. Ltd.) to a thickness of 150 Å on the hole injection layer. A blue light emission layer was formed by doping 5 wt % BD052 (available from Idemitsu Co. Ltd.) into BH215 (available from Idemitsu Co. Ltd.) and vacuum depositing the resultant to a thickness of 80 Å on the hole transport layer. A green light emission layer was formed by doping 7 wt % Ir(PPy)$_3$ into TMM004 (available from Merck & Co.) and vacuum depositing the resultant to a thickness of 100 Å on the blue light emission layer. A red light emission layer was formed by doping 15 wt % TER021

(available from Merck & Co.) into TMM004 (available from Merck & Co.) and vacuum depositing the resultant to a thickness of 120 Å on the green light emission layer. As a result, a white light emission layer, in which the green, blue, and red emission layers were stacked, respectively, was formed. A hole block layer, an electron transport layer, and an electron injection layer were sequentially formed by vacuum depositing Balq to a thickness of 50 Å, vacuum depositing $Alq_3$ to a thickness of 300 Å, and vacuum depositing LiQ to a thickness of 5 Å on the red light emission layer. A second electrode including stacked layers of Yb and Ag was formed by vacuum depositing Yb to a thickness of 10 Å and vacuum depositing Ag to a thickness of 70 Å on the electron injection layer.

A transmittance of the OLED display device and a sheet resistance of the second electrode were measured.

Experimental Example 2

A substrate, a first electrode, and an emission layer were formed by the same method as Experimental Example 1, and a second electrode including stacked layers of Yb and Ag was formed by vacuum depositing Yb to a thickness of 20 Å and vacuum depositing Ag to a thickness of 70 Å.

A transmittance of the OLED display device and a sheet resistance of the second electrode were measured.

Experimental Example 3

A substrate, a first electrode, and an emission layer were formed by the same method as Experimental Example 1, and a second electrode including stacked layers of Yb and Ag was formed by vacuum depositing Yb to a thickness of 30 Å and vacuum depositing Ag to a thickness of 70 Å.

A transmittance of the OLED display device and a sheet resistance of the second electrode were measured.

Experimental Example 4

A substrate, a first electrode, and an emission layer were formed by the same method as Experimental Example 1, and a second electrode including stacked layers of Yb and Ag was formed by vacuum depositing Yb to a thickness of 40 Å and vacuum depositing Ag to a thickness of 70 Å.

A transmittance of the OLED display device and a sheet resistance of the second electrode were measured.

Experimental Example 5

A substrate, a first electrode, and an emission layer were formed by the same method as Experimental Example 1, and a second electrode including stacked layers of Yb and Ag was formed by vacuum depositing Yb to a thickness of 20 Å and vacuum depositing Ag to a thickness of 50 Å.

A transmittance of the OLED display device and a sheet resistance of the second electrode were measured.

Experimental Example 6

A substrate, a first electrode, and an emission layer were formed by the same method as Experimental Example 1, and a second electrode including stacked layers of Yb and Ag was formed by vacuum depositing Yb to a thickness of 20 Å and vacuum depositing Ag to a thickness of 60 Å.

A transmittance of the OLED display device and a sheet resistance of the second electrode were measured.

Experimental Example 7

A substrate, a first electrode, and an emission layer were formed by the same method as Experimental Example 1, and a second electrode including stacked layers of Yb and Ag was formed by vacuum depositing Yb to a thickness of 20 Å and vacuum depositing Ag to a thickness of 80 Å.

A transmittance of the OLED display device and a sheet resistance of the second electrode were measured.

Experimental Example 8

A substrate, a first electrode, and an emission layer were formed by the same method as Experimental Example 1, and a second electrode including stacked layers of Yb and Ag was formed by vacuum depositing Yb to a thickness of 20 Å and vacuum depositing Ag to a thickness of 90 Å.

A transmittance of the OLED display device and a sheet resistance of the second electrode were measured.

Comparative Example 1

A substrate, a first electrode, and an emission layer were formed by the same method as Experimental Example 1, and a second electrode was formed to a thickness of 120 Å by mixing Mg and Ag at an atomic ratio of 10:1.

A transmittance of the OLED display device and a sheet resistance of the 11 second electrode were measured.

Comparative Example 2

A substrate, a first electrode, and an emission layer were formed by the same method as Experimental Example 1, and a second electrode was formed to a thickness of 140 Å by mixing Mg and Ag at an atomic ratio of 10:1.

A transmittance of the OLED display device and a sheet resistance of the second electrode were measured.

Comparative Example 3

A substrate, a first electrode, and an emission layer were formed by the same method as Experimental Example 1, and a second electrode was formed to a thickness of 160 Å by mixing Mg and Ag at an atomic ratio of 10:1.

A transmittance of the OLED display device and a sheet resistance of the second electrode are measured.

Comparative Example 4

A substrate, a first electrode, and an emission layer were formed by the same method as Experimental Example 1, and a second electrode was formed to a thickness of 180 Å by mixing Mg and Ag at an atomic ratio of 10:1.

A transmittance of the OLED display device and a sheet resistance of the second electrode were measured.

Comparative Example 5

A substrate, a first electrode, and an emission layer were formed by the same method as Experimental Example 1, and a second electrode was formed to a thickness of 200 Å by mixing Mg and Ag at an atomic ratio of 10:1.

A transmittance of the OLED display device and a sheet resistance of the second electrode were measured.

A sheet resistance of an upper electrode of an OLED display device measured according to Experimental Examples 1 to 8 and Comparative Examples 1 to 5 is shown in Table 1.

Referring to Table 1, sheet resistances of Experimental Examples 2, 3, 7 and 8 are 45 ohm/square or less, but sheet resistances of Experimental Examples 1, 4, 5 and 6 exceed 45 ohm/square. Generally, a sheet resistance of an upper electrode of an OLED display device may be 45 ohm/square or less. In view of the operability of the electrode, it is not preferable that a sheet resistance exceeds the value. Therefore, Yb may be formed to a thickness of 20 Å to 30 Å, and Ag may be formed to a thickness of 70 Å to 90 Å.

TABLE 1

|  | Thickness (Å) | Sheet Resistance (ohm/square) | | | | | Average |
| --- | --- | --- | --- | --- | --- | --- | --- |
| Experimental Example 1 | 10/70 | 44.4 | 44 | 47 | 46.1 | 47.5 | 45.80 |
| 2 | 20/70 | 41.9 | 40.9 | 41.3 | 40.7 | 40.7 | 41.10 |
| 3 | 30/70 | 41.2 | 41.2 | 43.3 | 42.1 | 42.2 | 42.00 |
| 4 | 40/70 | 46.7 | 46.4 | 46.4 | 45.9 | 45.4 | 46.16 |
| 5 | 20/50 | over range | | | | | |
| 6 | 20/60 | 1127 | 1281 | 1255 | 1423 | 969 | 1211 |
| 7 | 20/80 | 36.48 | 34.89 | 36.26 | 36.11 | 36.11 | 35.97 |
| 8 | 20/90 | 24.2 | 23.58 | 23.9 | 23.9 | 23.87 | 23.89 |
| Comparative Example 1 | 120 Å | 38.67 | 38.31 | 38.74 | 40.51 | 39.62 | 39.33 |
| 2 | 140 Å | 30.24 | 30.19 | 30.16 | 31.18 | 31.54 | 30.92 |
| 3 | 160 Å | 25.22 | 25.03 | 25.31 | 26.14 | 25.66 | 25.54 |
| 4 | 180 Å | 19.86 | 20.25 | 19.89 | 20.04 | 20.3 | 20.06 |
| 5 | 200 Å | 17.85 | 17.62 | 18.55 | 18.36 | 18.28 | 18.14 |

Figure 3:
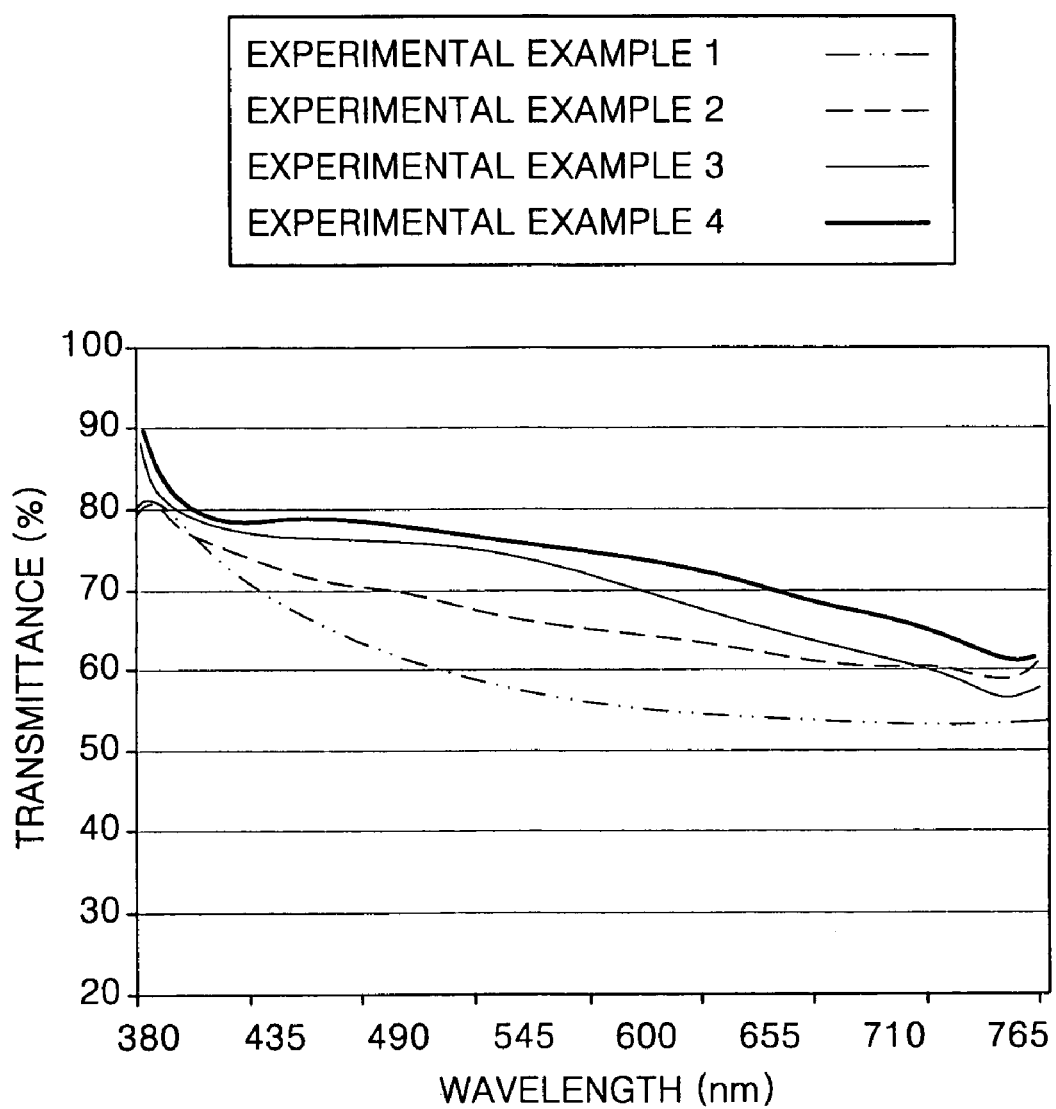
FIGS. 3 and 4 are graphs showing a change in transmittance according to a thickness of ytterbium (Yb) and silver (Ag) according to experimental examples.
Figure 4:
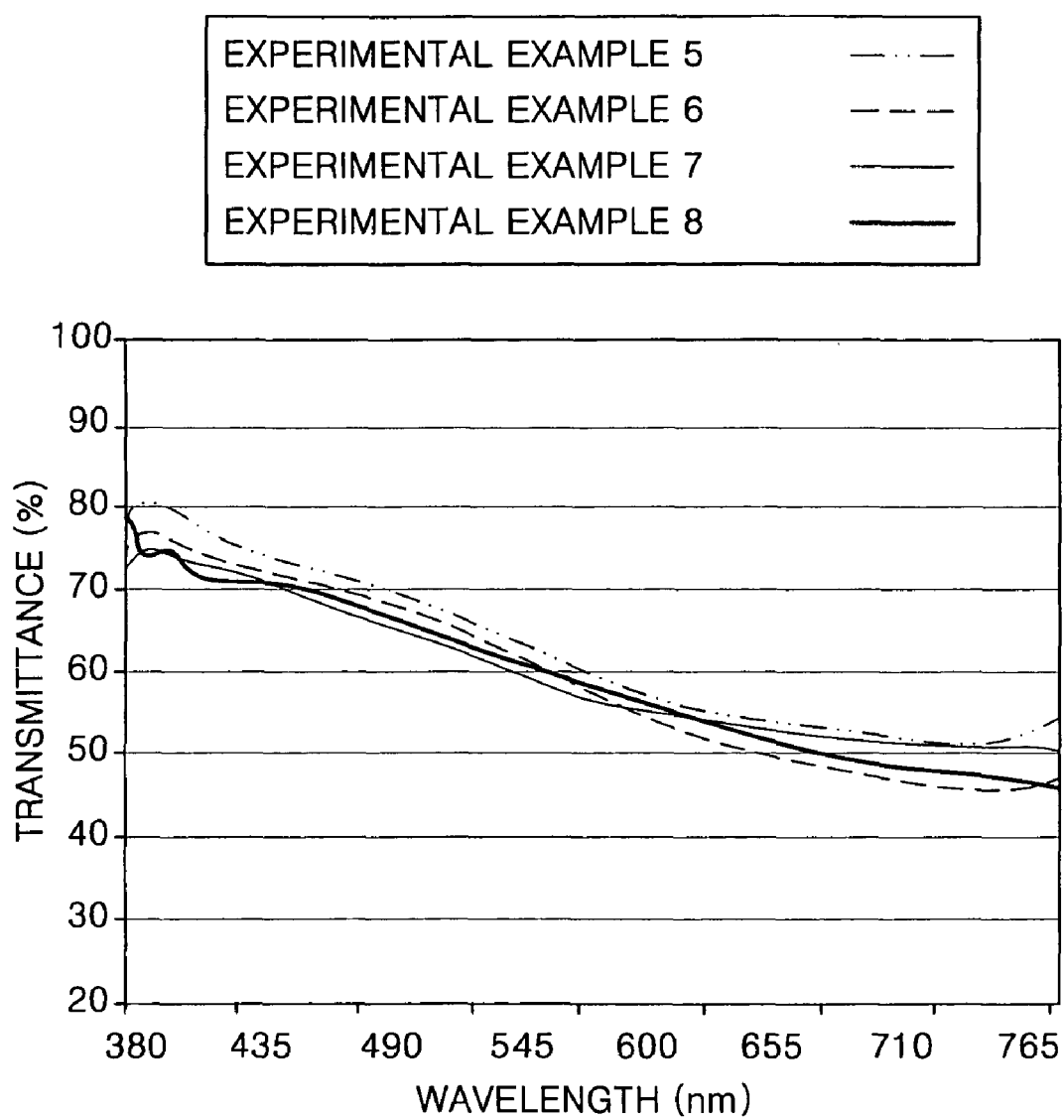
Figure 5:
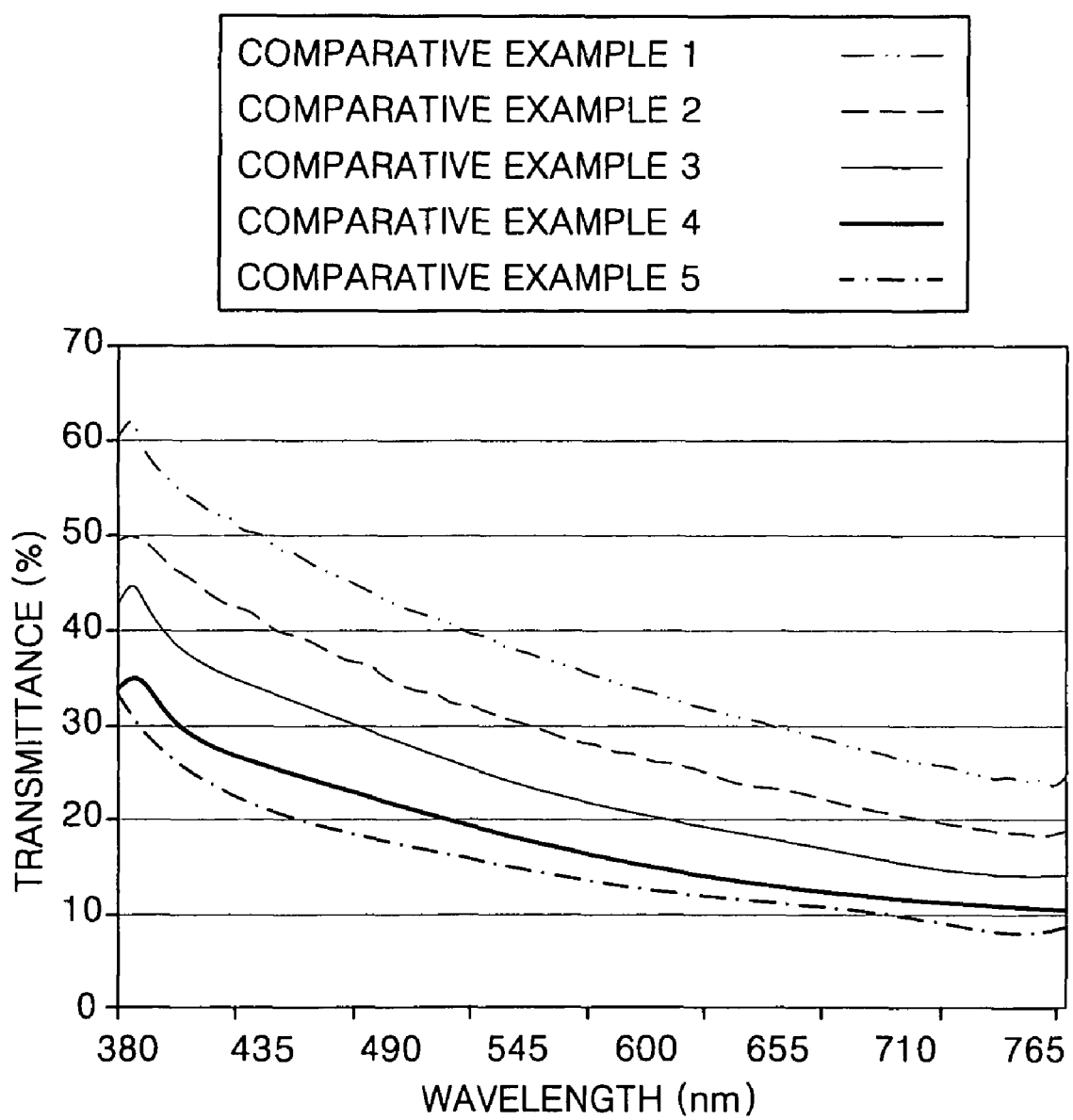
FIG. 5 is a graph showing a change in transmittance according to a thickness of magnesium-silver (MgAg) according to comparative examples.

FIGS. 3 to 5 are graphs showing a transmittance of an OLED display device according to Experimental Examples 1 to 8 and Comparative Examples 1 to 5.

Referring to FIG. 3, a transmittance of 50% to 80% over the entire emission wavelength range is represented in Experimental Example 1, and a transmittance of 60% to 80% is represented in Experimental Example 2. Also, a transmittance of 57% to 87% is represented in Experimental Example 3, and a transmittance of 62% to 90% is represented in Experimental Example 4.

Referring to FIG. 4, a transmittance of 52% to 81% over the entire emission wavelength range is represented in Experimental Example 5, a transmittance of 46% to 76% is represented in Experimental Example 6, and a transmittance of 50% to 75% is represented in Experimental Example 7. In addition, a transmittance of 46% to 78% is represented in Experimental Example 8.

Referring to FIG. 5, a transmittance of 25% to 61% over the entire emission wavelength range is represented in Comparative Example 1, a transmittance of 18% to 50% is represented in Comparative Example 2, and a transmittance of 15% to 45% is represented in Comparative Example 3. Also, a transmittance of 10% to 35% is represented in Comparative Example 4, and a transmittance of 9% to 33% is represented in Comparative Example 5.

As a result, the OLED display device including the second electrode formed of the stacked layer of Yb and Ag according to Experimental Examples 1 to 8 has a higher transmittance over the entire emission wavelength range of the emission layer than the OLED display device including the second electrode formed of MgAg according to Comparative Examples 1 to 5. In particular, in the case of the OLED display device according to Experimental Examples 2, 3, 7 and 8, since the OLED display device has a sheet resistance of 45 ohm/square or less and a higher transmittance than the OLED according to Comparative Examples 1 to 5 according to a conventional art, it may be preferable as a second electrode.

Comparing Experimental Example 8 with Comparative Example 1, while the second electrode according to Experimental Example 8 formed to a thickness of 110 Å is thinner than the second electrode according to Comparative Example 1 formed to a thickness of 120 Å, it has a 20% higher transmittance over the entire emission wavelength range and a lower sheet resistance than the second electrode according to Comparative Example 1 by 15.5 ohm/square.

Also, in the OLED display device according to Experimental Examples 1 to 8, the second electrode has a high transmittance over the entire emission wavelength range to thereby minimize microcavity effects. Therefore, when an emission layer is formed by mixing two or more colors of light having different wavelengths to thereby emit white light, an emission wavelength corresponding to each color of light does not incline to a certain wavelength due to removal of the microcavity effects, and may pass with a high transmittance, so that it may implement the white light.

Consequently, in a top-emitting OLED display device according to the embodiment of the present invention, an upper electrode is formed of stacked layers of Yb and Ag to thereby improve a transmittance over the entire emission wavelength range, and as a result, emission efficiency is also improved. In addition, microcavity effects are minimized, and in particular, when white light is implemented by mixing light of different wavelengths, balanced colors of light may be implemented due to the removal of the microcavity effects, so that it may be optimized to implement the white light.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting diode (OLED) display device, comprising:
  a substrate;
  a first electrode arranged on the substrate;
  an organic layer comprising an emission layer, the organic layer arranged on the first electrode; and
  a second electrode comprising an ytterbium (Yb) only layer arranged on the organic layer and a silver (Ag) only layer arranged on the ytterbium layer, the Yb only layer having a thickness of 20 Å to 30 Å, and the Ag only layer having a thickness of 70 Å to 90 Å, wherein the second electrode has a sheet resistance of 45 ohm/square or less.

2. The device of claim 1, wherein the second electrode has a transmittance of 46% to 90% within a wavelength range of 380 nm to 765 nm.

3. The device of claim 1, wherein the emission layer is a white light emission layer.

4. The device of claim 3, the white light emission layer has a structure, in which a plurality of emission layers emitting light of different wavelength regions are stacked.

5. The device of claim 3, further comprising at least one of a color filter layer and a color conversion layer formed on the second electrode.

6. The device of claim 1, wherein the emission layer is a blue light emission layer.

7. The device of claim 6, further comprising a color conversion layer formed on the second electrode.

8. The device of claim 1, wherein the emission layer comprises red, green, and blue light emission layers respectively formed in red, green, and blue pixel regions.

9. The device of claim 1, wherein the first electrode comprises a reflective layer and a transparent electrode material arranged on the reflective layer.

10. The device of claim 9, wherein the reflective layer is comprised of a material selected from a group consisting of silver (Ag), aluminum (Al), chrome (Cr), molybdenum (Mo), tungsten (W), titanium (Ti), gold (Au), palladium (Pd) and an alloy thereof.

11. A top-emitting organic light emitting diode (OLED) display device, comprising:
   a substrate;
   a first electrode arranged on the substrate, the first electrode comprising a reflective layer and a transparent electrode material arranged on the reflective layer;
   an organic layer comprising an emission layer, the organic layer being arranged on the first electrode; and
   a second electrode comprising an ytterbium (Yb) only layer arranged on the organic layer and a silver (Ag) only layer arranged on the ytterbium only layer, the Yb only layer having a thickness of 20 Å to 30 Å, and the Ag only layer having a thickness of 70 Å to 90 Å, wherein the second electrode has a sheet resistance of 45 ohm/square or less.

12. The device of claim 11, wherein the second electrode has a transmittance of 46% to 90% within a wavelength range of 380 nm to 765 nm.

13. The device of claim 11, wherein the emission layer is a white light emission layer.

14. A method of manufacturing an OLED display device, comprising:
   providing a substrate;
   forming a first electrode on the substrate;
   forming an organic layer comprising an emission layer on the first electrode; and
   forming a second electrode comprising an ytterbium (Yb) only layer on the organic layer and a silver (Ag) only layer on the ytterbium layer, wherein the Yb only layer has a thickness of 20 Å to 30 Å, and the Ag only layer has a thickness of 70 Å to 90 Å, wherein the second electrode has a sheet resistance of 45 ohm/square or less.

15. The method of claim 14, wherein the second electrode is produced by a process selected from a group consisting of a sputtering process and a vacuum deposition process.

16. The method of 14, wherein the first electrode is formed by forming a reflective layer on the substrate and stacking a transparent electrode material on the reflective layer.

17. The method of claim 14, the wherein the emission layer is a white light emission layer.

* * * * *